(12) United States Patent
Mallinson (10) Patent No.: US 7,028,070 B2
(45) Date of Patent: Apr. 11, 2006

(54) HIGH SPEED FILTER

(75) Inventor: Andrew Martin Mallinson, Kelowna (CA)

(73) Assignee: ESS Technology, Inc., Fremont, CA (US)

( * ) Notice: Subject to any disclaimer, the term of this patent is extended or adjusted under 35 U.S.C. 154(b) by 669 days.

(21) Appl. No.: 10/057,087

(22) Filed: Jan. 26, 2002

(65) Prior Publication Data

US 2002/0129070 A1    Sep. 12, 2002

(30) Foreign Application Priority Data

Jan. 29, 2001    (CA)    ................................ 2332609

(51) Int. Cl.
G06G 1/02    (2006.01)

(52) U.S. Cl. ........................................ 708/819; 708/5

(58) Field of Classification Search ................ 708/819, 708/5, 2

See application file for complete search history.

(56) References Cited

U.S. PATENT DOCUMENTS

| | | | |
|---|---|---|---|
| 4,161,033 A | 7/1979 | Martinson | 364/728 |
| 4,318,080 A * | 3/1982 | Yoshida | 382/217 |
| 4,403,331 A | 9/1983 | Halpern et al. | 375/37 |
| 4,475,170 A * | 10/1984 | Haque | 708/819 |
| 4,550,415 A | 10/1985 | Debus, Jr. et al. | 375/14 |
| 4,580,224 A | 4/1986 | Gerber | 364/472 |
| 4,667,203 A | 5/1987 | Counselman, III | 342/357 |
| 4,860,018 A | 8/1989 | Counselman, III | 342/357 |
| 4,870,422 A | 9/1989 | Counselman, III | 342/357 |
| 5,014,327 A | 5/1991 | Potter et al. | 382/14 |
| 5,021,793 A | 6/1991 | Stangel et al. | 342/383 |
| 5,168,213 A * | 12/1992 | Wardle et al. | 324/76.27 |
| 5,194,871 A | 3/1993 | Counselman, III | 342/357 |
| 5,353,026 A * | 10/1994 | Wilson | 341/143 |
| 5,384,574 A | 1/1995 | Counselman, III | 342/357 |
| 5,438,532 A * | 8/1995 | Nagao et al. | 708/319 |
| 5,463,657 A | 10/1995 | Rice | 375/200 |
| 5,469,469 A | 11/1995 | Haines | 375/201 |
| 5,537,435 A | 7/1996 | Carney et al. | 375/219 |
| 5,563,819 A * | 10/1996 | Nelson | 708/819 |
| 5,754,603 A | 5/1998 | Thomas et al. | 375/367 |
| 5,901,075 A * | 5/1999 | Offord et al. | 708/322 |
| 5,914,983 A * | 6/1999 | Bowser et al. | 375/232 |
| 5,999,561 A | 12/1999 | Naden et al. | 375/206 |
| 6,032,171 A * | 2/2000 | Kiriaki et al. | 708/819 |
| 6,111,911 A | 8/2000 | Sanderford, Jr. et al. | 375/147 |
| 6,141,373 A | 10/2000 | Scott | 375/150 |
| 6,154,486 A | 11/2000 | Scott et al. | 375/142 |
| 6,718,355 B1 * | 4/2004 | Felts et al. | 708/319 |

* cited by examiner

*Primary Examiner*—Tan V. Mai
(74) *Attorney, Agent, or Firm*—Stevens Law Group, P.C.

(57) ABSTRACT

An electronic filter operates as a correlator that provides a discrete approximation of an analog signal. The analog to digital conversion is integrated directly approximation calculation. An array of sample and hold circuits or single bit comparators provide outputs to a series of multipliers, the other input of which is a coefficient value of a Fourier series approximation of the desired frequency response. Each of the sample and hold circuits samples sequentially in time and holds its sample until the next cycle. Thus the sample point rotates in time through the array and each new sample is multiplied by a different coefficient. The output of the multipliers is summed for evaluation.

13 Claims, 8 Drawing Sheets

HIGH SPEED FILTER

RELATED APPLICATIONS

This application claims priority to Canadian Patent Application Serial No. 2,332,609, entitled High Speed Filter, filed Jan. 29, 2001.

TECHNICAL FIELD OF THE INVENTION

This invention relates to signal processing and in particular to a method and circuit for implementing an electronic filter.

BACKGROUND OF THE INVENTION

A known class of DSP filters operate by successively sampling the input signal and implementing the following discrete Fourier approximation:

$$R = \sqrt{S_s \cdot S_s + S_c \cdot S_c} \text{ where}$$

$$S_s = \sum_{n=0}^{m} X_n \cdot \sin(f \cdot k \cdot n), S_c = \sum_{n=0}^{m} X_n \cdot \cos(f \cdot k \cdot n)$$

One such type of filter is known as a Finite Impulse Response (FIR) filter. The input signal is sampled, and each sample is fed in turn to a series of multipliers the other input to which is one of the Fourier coefficients or its analog. As one sample is shifted out of a first multiplier to the next one, the next sample in time is presented to the first multiplier, and so on.

While the foregoing approaches have proven useful for lower frequencies requiring moderate sampling rates, they remain impractical for frequencies approaching 1 Ghz. This is due principally to the number of analog to digital conversions and calculations required at high sampling rates and to limitations in the processing speed of the digital components involved.

It is an object of the present invention to provide a means for identifying or extracting a signal using a discrete approximation analysis, but that is suitable for frequencies well in excess of 1 Ghz.

SUMMARY OF THE INVENTION

The invention relies on a discrete approximation analysis of an analog signal that is broadly analogous to a discrete Fourier approximation but that is more properly characterized as a correlator.

The analog to digital converter is integrated into the approximation calculation itself, thereby also significantly increasing the frequency at which the circuit is effective and practical.

An analog circuit is used as the processing element in the integral calculation, it uses phase shifted sampling of the input signal to lessen the burden of speed on the ADC and finally it may be modified to use the principle of very many single bit ADC converters to further simplify the analog processing element.

An array of sample and hold circuits (or single bit comparator ADCs) is provided. In this disclosure the term "SHA" refers to "Sample and Hold Amplifiers" and is the sampling circuit. Each of the outputs of the SHAs is fed to a multiplier the other input of which is a coefficient value in a Fourier series approximation of the desired frequency response. Each of the SHAs samples sequentially in time and holds its sample until called on to sample again in another cycle. Thus the sample point rotates in time through the array and each new sample is fed to a different coefficient. The output is summed in a bus for evaluation.

In one of its aspects, the invention comprises a circuit for correlating an input signal. The circuit includes a parallel array of processing elements, each of said processing elements comprising an analog sampling circuit for sampling the input signal in response to a timing signal, and a circuit for scaling the resulting sample according to a predetermined scaling factor. The timing circuit causes the timing signal to be presented in time-delayed succession to successive ones of the processing elements. The scaled output of the processing elements is summed.

In another aspect of the invention, the scaling factors in the successive processing elements correspond to the coefficients in a Fourier series approximation of a desired frequency response.

The timing circuit may comprise a plurality of delay elements, the outputs of which are presented to successive ones of the processing elements.

In another aspect of the invention, the scaling circuit comprises a multiplier having as inputs the output of the sampling circuit and a predetermined scaling factor, and the outputs of the multipliers are summed.

In yet another aspect of the invention, the scaling factors in successive processing elements correspond to the coefficients in a Fourier series approximation of a desired frequency response. The timing circuit comprises a plurality of delay elements, the outputs of which are presented to successive ones of the processing elements, and the circuit for scaling comprises a multiplier having as inputs the output of the sampling circuit and a predetermined scaling factor, the outputs of the multipliers being summed.

In another of its aspects, the invention is the method of correlating an input signal to an apparent reference signal, comprising generating a series of phase shifted analog samples of the input signal, scaling successive ones of the samples by coefficient values representing the reference signal and summing the scaled samples.

In another aspect of the invention, the step of generating a series of phase shifted analog samples comprises providing phase shifted timing signals to a plurality of analog sample and hold circuits.

In yet another aspect of the invention, the coefficient values comprise the coefficients of a Fourier series approximation of the frequency response of the reference signal.

In a further aspect of the invention, the step of generating a series of phase shifted analog samples comprises providing phase shifted timing signals to a plurality of analog sample and hold circuits.

In another of its aspects, the invention is a circuit for correlating an input signal with a desired frequency response. The circuit comprises a first and a second arrays of parallel processing elements, each of said processing elements comprising an analog sampling circuit for sampling the input signal in response to a timing signal, and a circuit for scaling the resulting sample according to a predetermined scaling factor. A timing circuit causes the timing signal to be presented in time-delayed succession to successive parallel pairs of the processing elements. A summer sums the scaled output of the processing elements comprising the first array and a summer sums the scaled output of the processing elements comprising the second array.

In another aspect of the invention, the first array represents a normal channel. and the second array represent a quadrature channel.

In yet another of its aspects, the invention is the method of correlating an input signal to an apparent reference signal, comprising generating a series of phase shifted analog samples of the input signal, scaling successive ones of the samples by coefficient values representing the normal component of the reference signal, scaling successive ones of the samples by coefficient values representing the quadrature component of the reference signal, summing the normal scaled samples, summing the quadrature scaled samples, and deriving the root mean square of said normal and quadrature sums.

In another is its aspects, the invention is a circuit for correlating an input signal comprising a parallel array of processing elements, each of said processing elements comprising a comparator for comparing said input signal with a predetermined reference value in response to a timing signal and outputting a value of +1 or −1, a timing circuit for causing said timing signal to be presented in time-delayed succession to successive ones of said processing elements, a multiplier for scaling the output of said comparator with a predetermined scaling factor representative of a normal or quadrature sine wave, and a summer for summing the scaled output of said processing elements.

Other aspects of the invention will be appreciated by reference to the detailed description which follows and to the claims.

BRIEF DESCRIPTION OF THE DRAWINGS

The invention will be appreciated by reference to the detailed description of the preferred embodiments and to the drawings thereof in which.

DETAILED DESCRIPTION OF THE PREFERRED EMBODIMENTS

This is the canonical form of the Fourier integral:

$$H(\omega) = \int_{-\infty}^{\infty} X(t) \cdot e^{j\omega t} dt$$

While implementation of the Fourier integral would be ideal for detecting a particular frequency, the need to integrate over all time and the continuous nature of the integral rule out its use. However, it is possible to implement the discrete Fourier approximation of the H(ω) term as $$R = \sqrt{S_S \cdot S_S + S_C \cdot S_c}$$

where $S_s = \sum_{n=0}^{m} X_n \cdot \sin(f \cdot k \cdot n), S_c = \sum_{n=0}^{m} X_n \cdot \cos(f \cdot k \cdot n)$ The term f is the frequency of interest and the constant k depends upon the time interval between samples n. Two summations are needed: one representing the real and one the imaginary term in the integral. $X_n$ is the n th sample of X. The summations are examples of the following sequence:

$$+X_n \cdot s_n + X_{n+1} \cdot s_{n+1} + X_{n+2} \cdot s_{n+2} + X_{n+3} \cdot s_{n+3}+$$

where the $s_n$ are the fixed (invariant for a particular receiver frequency) sine and cosine terms and the $X_n$ are the samples of the input signal from the radio antenna.

In prior art filters, $X_n$ represents the successive outputs of the ADC and the summations are implemented in the DSP chip. However, the time between samples needs to be very short in order to capture high frequencies that are currently interesting. For example, to process a radio signal in the 2.4 Ghz range, the interval between samples n needs to be of the order of 200 pS or less, corresponding to an ADC running at over 5 Ghz. As of the filing date of this application, the fastest commercially available ADC single chip is about 2 Ghz. If the receiver is a Bluetooth receiver the data is sent in the channel as a GFSK signal at a 1.0 Mhz data rate. The summations must be performed every 1 μS at least to get the data bit from the channel. To select a frequency up to 2.4 Ghz, Nyquist's sampling theorem requires sampling at least twice as fast. A desirable sampling rate would be, for example, 10 Ghz.

Without benefit of the present invention, the ADC would need to run at the extraordinarily high rate of 10 GS/s (samples per second) and the DSP would need to accumulate 10,000 of these samples and calculate 20,000 multiply/additions in 1 μS. Thus a 10 GS/s ADC and a 40,000 MIP DSP chip would be needed to do this task. This is well beyond the state of the art today. A powerful Pentium may approach 200 MIPS and the fastest available ADC is 2 Ghz. One would need the equivalent of 200 Pentium chips and an ADC five times faster than the state of the art.

However, this is not beyond the performance of an analog circuit. The present invention implements something very similar to the Fourier integral but as a substantially analog signal processing array. In one embodiment, analog samples of the input signal are processed. In a second embodiment, a single bit sample of the input signal is processed.

Figure 1:
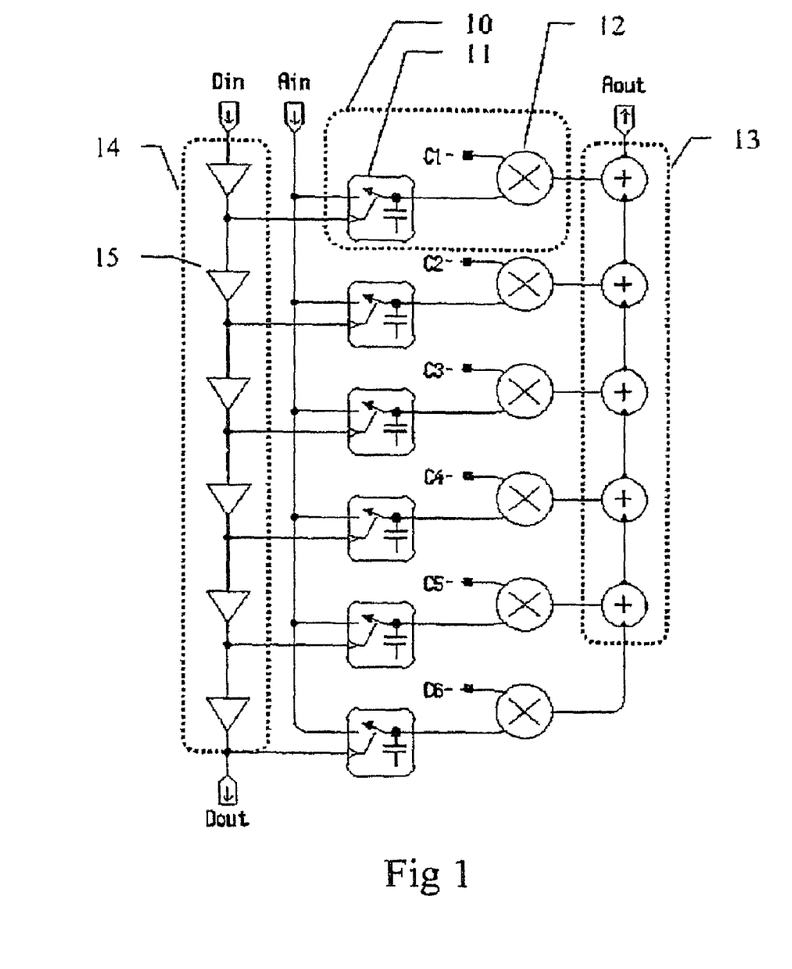
FIG. 1 is a circuit diagram of one embodiment of the invention wherein the signal is sampled on an analog basis.

FIG. 1 illustrates the preferred embodiment of the invention based on the processing of analog samples of the input signal. A unit processing element 10 is formed from the combination of a sample and hold device (SHA) 11, an analog multiplier 12 and a constant term $C_n$ that can be represented in a constant fashion as the value of current source, resistor or similar; or as a programmable element in form of a register and digital to analog converter (DAC). The constants $C_n$ represent the coefficients of the Fourier series approximation of the frequency response of the signal to be detected.

Each unit processing element 10 is configured to sample the input signal $A_{in}$ and apply the sample to the analog multiplier 12, the other input coming from the constant (or semi-constant DAC/register) element $C_n$. A plurality of unit processing elements 10 are arrayed to sample the analog input signal successively in time. The output of the multiplier is configured to sum into a common bus 13. The bus may be a simple pair of nodes, the output of the analog multiplier being a differential current into these nodes, or any other means by which an inherent summation can be made to occur.

A delay circuit 14 is designed to apply the sample signal $D_{in}$ to the SHA and then apply a known delay in time before passing the signal to the next unit processing element. In this way the SHA devices are made to sample successively in time. Although conveniently done as a cascade of connected elements 15 implemented adjacent to the unit processing elements, the successive sampling means may be provided in any form available to the designer of the system. This application of successive samples may occur very quickly— in the state of the art today the successive sampler may be derived from a chain of gates or similar and the delay between samples therefore made less then 100 pS without much difficulty. Those skilled in the art will recognize the need to provide for an interval of time when the sampling device is re-acquiring the signal: this disclosure recognizes that the SHA may require a pair of devices and the description of the SHA element may therefore consist of the equivalent of two conventional SHA devices. Due to the number M of unit processing elements present, each equivalent sampler is only required to cycle at the signal sampling rate divided by M.

The sampling of the analog sampler array is conveniently provided by use of a time delay (or phase shifting) element 15 adjacent to each analog sampler. The control of the time delaying element, for example using a Delay Lock Loop (or Phase Lock Loop), is well known in the art. Many samples of the input are taken within one operational cycle: each of the unit processing elements samples once in the cycle. The output of the array is equivalent to a single ADC operating at M times the operational cycle rate (where M is the number of sampler elements) in the more conventional ADC and DSP implementation.

The output quantity, the sum of products, is available at all times. The SHA devices are sampling in sequence. At all times an estimate of the Fourier component of the sine (normal) or cosine (quadrature) signal is available because the constants of one set of unit processing elements constitute the normal channel and the constants of the second set of unit processing elements represent the quadrature channel. The system designer may choose to evaluate the RMS output or not, in digital or analog fashion. It will be obvious to those skilled in the art how this may be done. This disclosure recognizes that the use of semi-programmable constants into the second input of the multiplier in the unit processing element will allow the dynamic switching of received frequency and possibly the sequential provision of normal and quadrature output. As may be obvious to those skilled in the art, by the application of conventional techniques to modify the sequential SHA timing the equivalent Fourier frequency may be changed.

How does this apparently simple analog circuit outperform the equivalent state of the art digital components? It does do by sheer weight of numbers. To implement one receiver channel of the type mentioned, 20,000 of these analog elements are required. This may seem a lot of elements, but in fact it is quite practical. If we assume that 30 transistors are required to make the unit processing element we have about the complexity of 5 static ram cells. Consequently we have the equivalent of about 100 k static ram cells: today static RAM can be made up 512 k on a chip so this design corresponds to a viable chip size. Each cell could operate at about 1 µA, hence the chip would consume about 20 mA.

Figure 4:
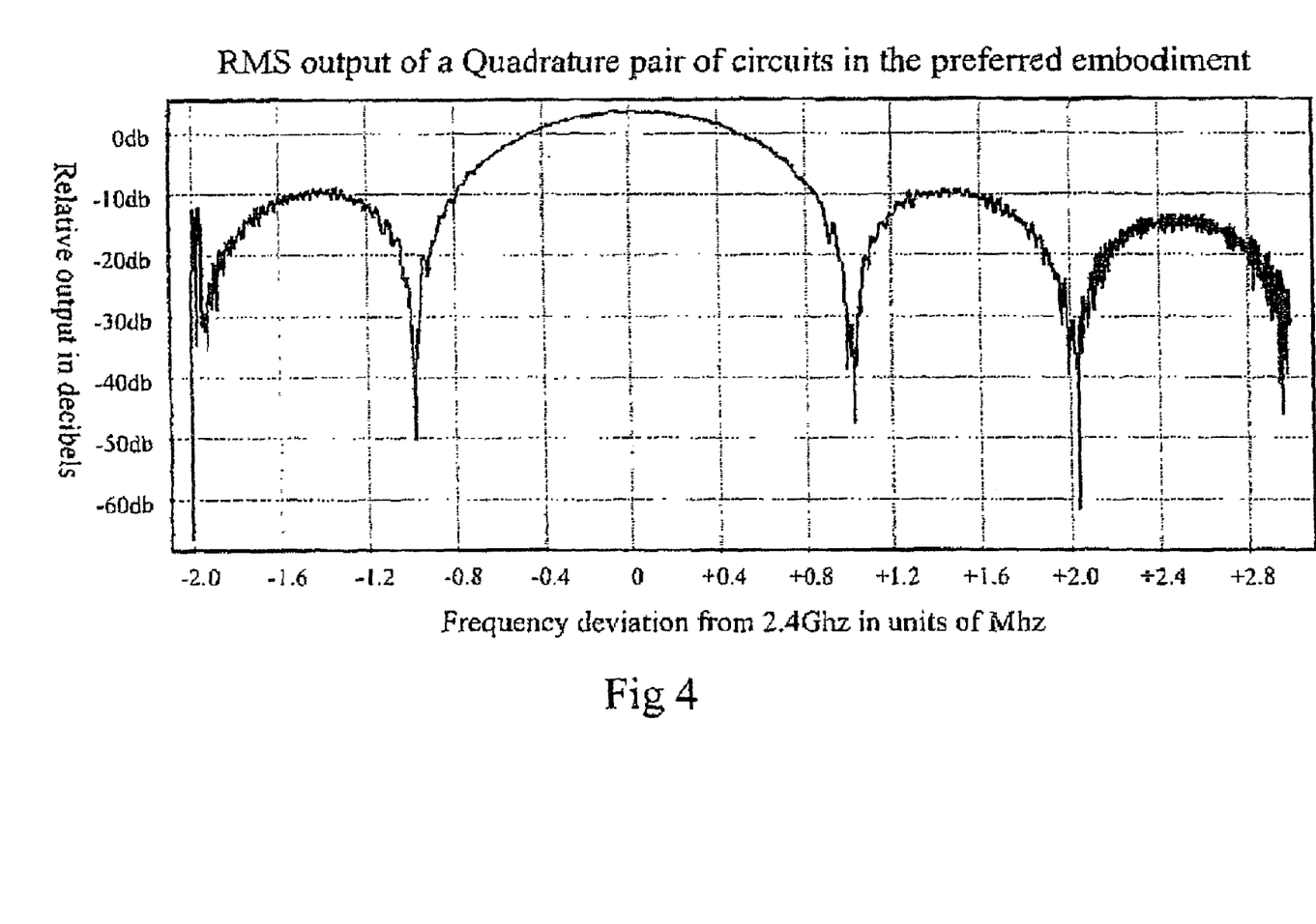
FIG. 4 is a plot of the RMS output of a pair of quadrature arrays of the embodiment of FIG. 1 with an input signal of 2.4 Ghz and 0 db of signal to noise ratio.

The response of the circuit of FIG. 1 is illustrated in FIG. 4. An input signal of 2.4 Ghz was used with 0 dB of signal to noise. A sample rate of 10 Ghz was used. The plot represents the RMS output of a pair of quadrature arrays, each having 10,000 unit processing elements.

In the alternative embodiment of FIG. 2, the SHA device is replaced with a strobed comparator 20 that is clocked by the sampling pulse and outputs a single bit to indicate whether or not the analog input is above or below an arbitrary reference level. It compares the sampled input signal with a reference and outputs a digital signal representative of $\{1,-1\}$ to the analog multiplier. The analog multiplier may now be degenerated to the case of providing a non-linear output of the form $\{C, -C\}$ where C is the local value of the constant or semi-constant term representative of the normal or quadrature sine wave. This has a small degrading effect on receiver sensitivity. A further advantage of the strobed comparator element becomes evident when considering the practicalities of implementation: it is not possible to produce a comparator that has identically zero offset voltage—this is significant because the offset voltage imposes a lower limit on the sensitivity of the device. To prevent the offset from limiting the sensitivity it will obvious to those skilled in the art that an averaging filter may be applied to the output of comparator (the sequences of output quantities $\{-1,1\}$) such that the mean output is zero, thus ensuring that no DC component is in the output data of each comparator. Consequently, upon receiving an infinitesimally small input signal (now limited only by the noise of the comparator input stage, not its DC offset) the comparator will begin to operate and a substantial improvement of sensitivity will be evident in the output of the array of processing elements.

Figure 2:
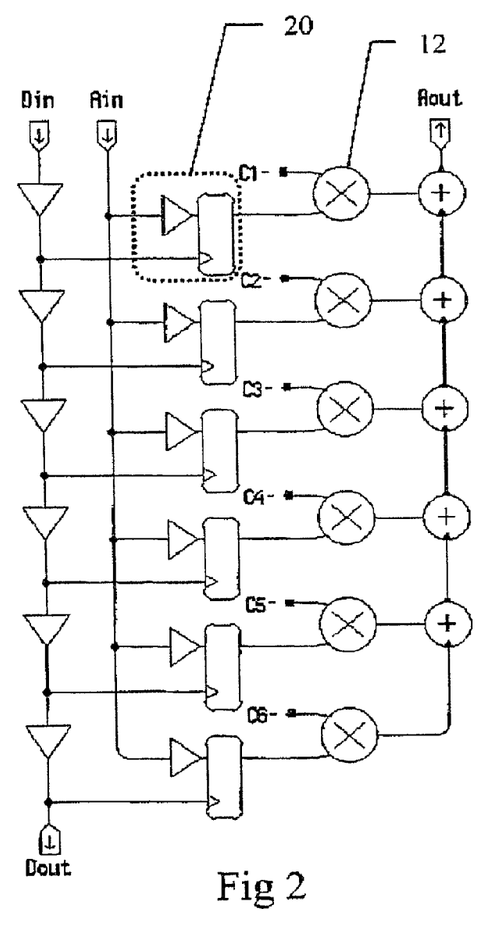
FIG. 2 is a circuit diagram of an alternative embodiment of the invention wherein the signal is sampled by a one-bit comparator.
Figure 5:
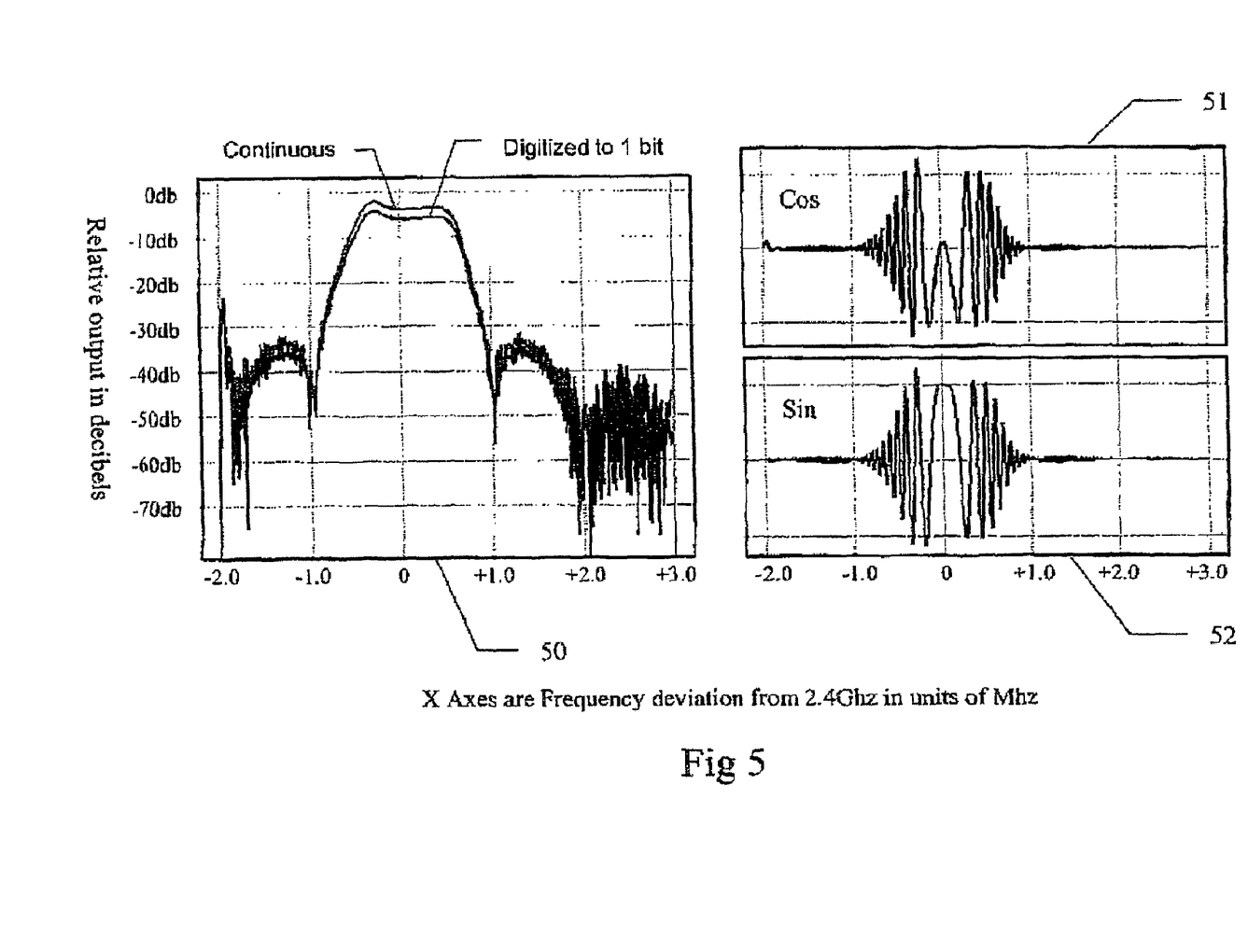
FIG. 5 is a comparative plot of the filtered RMS output of a pair of quadrature arrays of the embodiments of FIG. 1 and FIG. 2.

FIG. 5 is a comparative plot of the filtered RMS output of a pair of quadrature arrays of the first and alternative embodiments of FIG. 1 and FIG. 2. Plot 50 shows the difference between the implementations of FIG. 1 and FIG. 2. Plots 51 and 52 show respectively, the outputs of the Cosine and Sine channels that make up the quadrature pair. As can be seen, the quality of the output signal is virtually identical.

Figure 3:
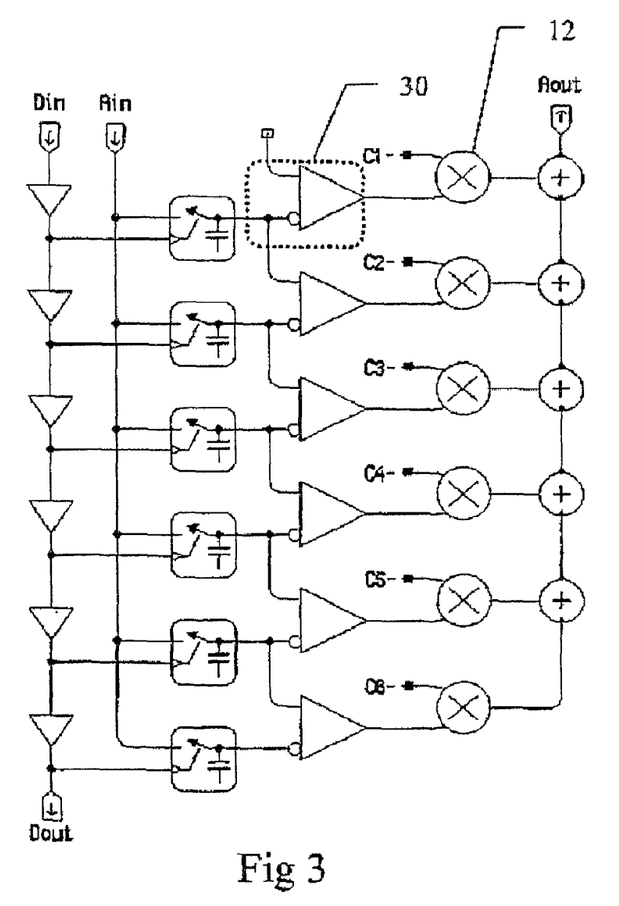
FIG. 3 is a circuit diagram of the preferred embodiment of the invention wherein a difference signal between successive samples is presented to the multiplier.

FIG. 3 illustrates the preferred embodiment of the invention. In this embodiment, the multiplier operates on the difference between successive samples. An element 30 to determine the voltage difference between successive samples is employed such that the multiplying element 12 is provided with an input that is in proportion to the difference between adjacent SHA elements. The advantage of this approach is that any systematic error in the SHA is cancelled since it appears in each input path.

Those skilled in the art will note similarity of the circuit of the invention to an analog version of the canonical FIR (Finite Impulse Response) filter. However, the present invention is not an analog FIR in the conventional sense. The SHAs in the array of unit processing elements of the invention are each loaded in turn but the coefficient value is left unchanged. In conventional FIRs the samples of input advance down the chain, experiencing as they go the various values of the coefficients. This leads to the well known observation that in an FIR, the Dirac delta function (a single "1" preceded by an infinite sequence of zeros and followed by an infinite sequence of zeros) applied to an FIR input causes the FIR output to present its coefficient values in sequence. This is not the case with this invention: application of the Dirac delta function to this invention results in a single output value that persists for the interval M·dt where M is the number of unit processing elements and dt is the delay between successive SHA samples in the array. Evidently, the impulse response of this invention is rectangular and further consideration will show that it is not constant with time.

The invention is in every respect a correlator, but the two signals to be correlated are not two input signals as in prior art correlators, but rather the input signal is correlated to an apparent or nominal sine wave represented by the array coefficients and by the SHA sample point advancing through the array. The generation of this correlation signal is achieved by a purely static arrangement of coefficients with the significant advantage that the multiplication action is to operate at a rate equal to Fin/M where M is the number of elements in the array. In fact M relates only to the correlation interval, which in turn relates to the bandwidth of correlation output data required. In the Bluetooth example of a 1 Mhz data rate and 2.4 GHz input signal sampled at 10 Ghz, M is 10,000. Generally, M=Fin·OSR/BW where Fin is the input signal frequency, OSR is the over-sampling ratio required to be at least 2, and BW is the output bandwidth.

The invention therefore achieves, without use of local oscillator, conventional mixer or any discrete filter of any kind, a "direct to base band conversion" of a very high input frequency; the accuracy depending on the delay between samples. It will be clear to those skilled in the art that in addition to this, a noise suppression factor of $\sqrt{M}$ is present in the system due to the RMS summation of non-correlated signals and further that phase noise present in the apparent correlation signal (possibly generated by jitter in the difference in SHA sample times) is averaged over the interval M·dt.

Figure 6:
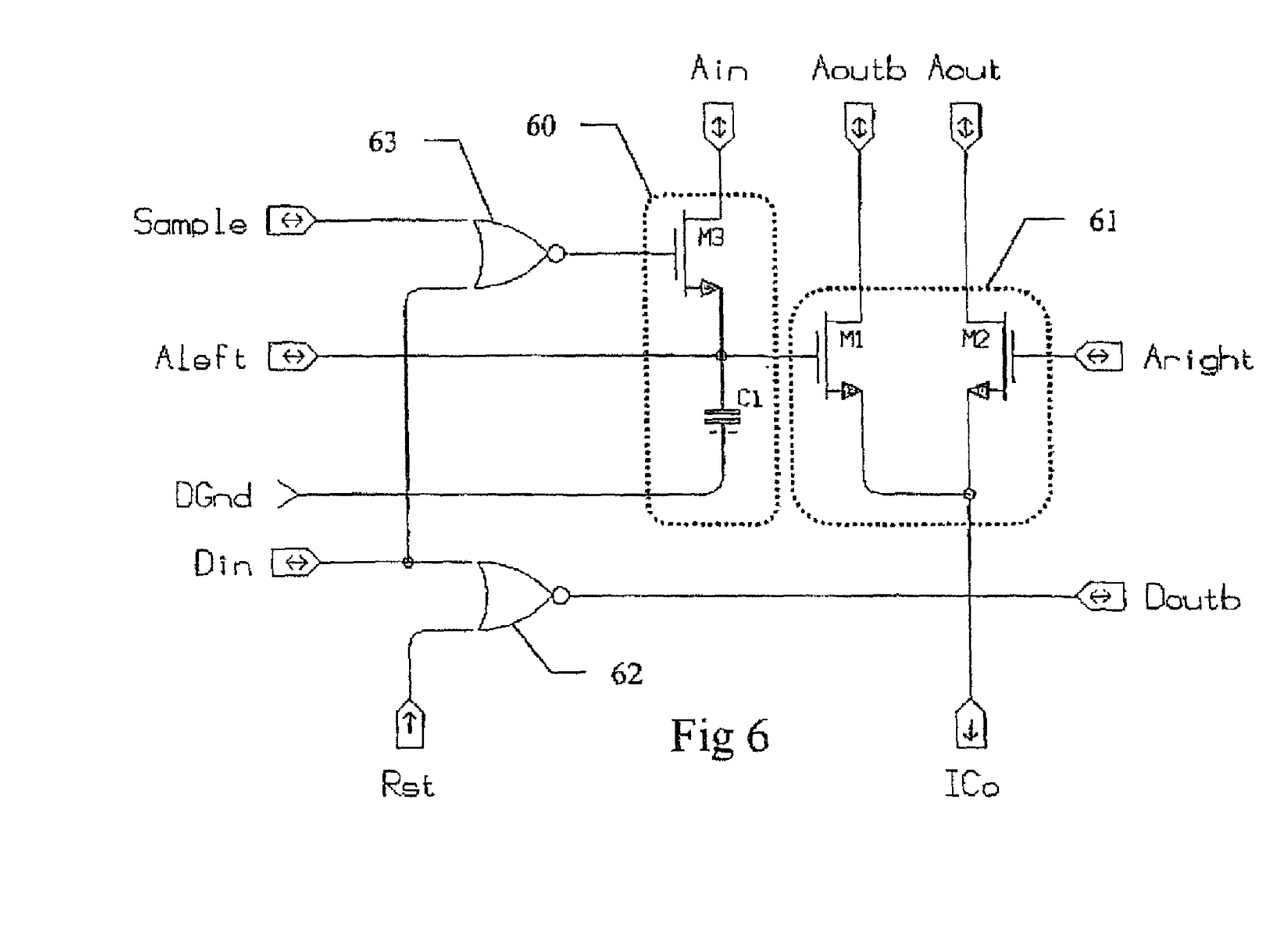
FIG. 6 is a schematic diagram of a circuit for implementing the preferred embodiment of FIG. 3.

FIG. 6 is a schematic diagram of a circuit for implementing the preferred embodiment of FIG. 3. Additional elements are shown in FIG. 6 such that a clear and working example of the disclosed invention may be presented. Specifically, use of an additional NOR gate 63 for the purpose of conveniently generating the pulse to the SHA 60 is shown. Also, a connection scheme that makes use of a delay element that introduces a logical inversion in the signal path is introduced (described in relation to FIG. 7) to demonstrate that the disclosure is not limited to a particular means to make the delay elements and the physical connection order of the repeating elements does not necessarily correspond to logical order of delayed signals provided to the array.

Figure 7:
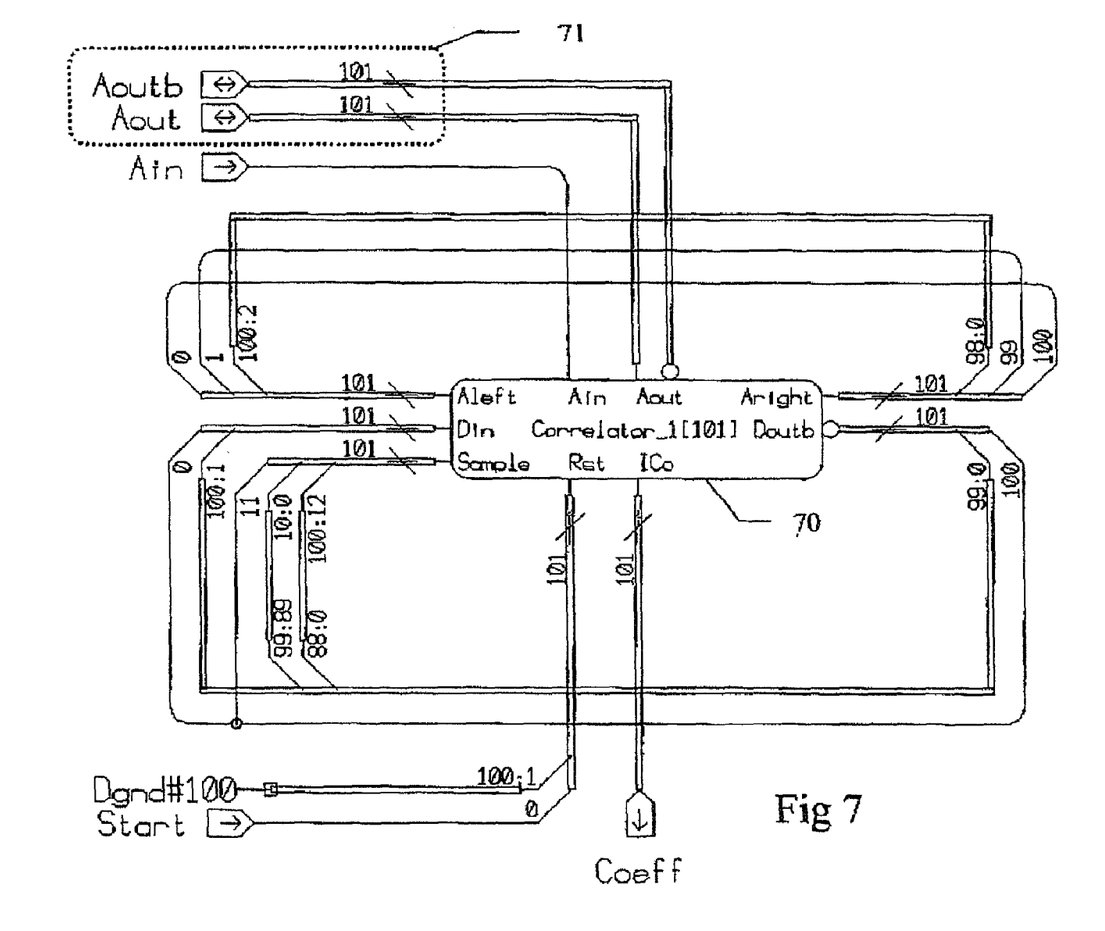
FIG. 7 is a wiring diagram for the implementation of the circuit of FIG. 6; and, FIG. 8 is a pair of graphs of a SPICE simulation of the circuit of FIGS. 6 and 7.

Elements 60 consisting of M3 and C1 make up the SHA element. Elements 61 consisting of M1 and M2 make up the multiplier element, and by virtue of the connections labelled "Aleft" and "Aright" connect to adjacent SHA devices. The element 30 in FIG. 3 is implicit in the connections to the devices M1 and M2 which are responsive to the difference between the voltages on Aleft and Aright. A NOR gate 62 constitutes the delaying element and includes an input Rst that may advantageously be employed to initialise the array. Element 63 and the wire labelled "Sample" connect to the sequence of delaying elements 62 at various points in the array and consequently the output of 63 generates a pulse that functions as the signal to cause the SHA 60 to sample the analog input present on the wire labelled "Ain". The wires labelled "Aout" and "Aoutb" constitute the outputs of the multiplying element 61. The current taken out of the wire labelled "Ico" constitutes the magnitude of the coefficient value applied to the cell. The sign of the coefficient value may be adjusted by the connection of Aout and Aoutb to the output bus. Connected directly, Aout to the output terminal and Aoutb to the inverse output terminal may be considered to represent a positive value of coefficient. Connecting them in reverse, namely Aoutb to the output terminal and Aout to the inverse output terminal, will then represent a negative coefficient value. The voltage on the wire labelled "DGnd" is taken to represent the nominal zero voltage. Din and Doutb are the means by which the sequence of delay elements 62 are connected to generate a sequence of pulses distributed in time to the SHA. The schematic provided is hierarchical and the contents of the cell are shown in FIG. 7. Various numerals on the wiring buses indicate the internal signals of the bus that are accessed as required.

FIG. 7 shows the preferred interconnection of the elements of FIG. 6. The icon labelled Correlator_1[101] (70) is taken to represent a set of 101 instances of the circuit elements of FIG. 6, labels on the periphery of the icon 70 representing the wires with similar labels in FIG. 6. An electronic schematic "bus construct" has been used to clarify the connectivity of the preferred embodiment shown here. Those skilled in the art will be familiar with these bus constructs, however more details are given here. Specifically, connections shown as a single line represent a single wire, connections shown as narrow rectangles represent a collection of wires or a "bus". Slashed oblique lines with adjacent integers are taken to indicate the number of wires within the bus so marked. Lines emerging at 45 degrees from within the narrow bus rectangle are taken to indicate the means to "tap" into the bus—that is to say, the means by which certain of the particular wires within the bus may be accessed. The integer or pair of integers delimited by the colon character (:), are indicative of the particular wires within the bus that are accessed by the tap. A single integer at the tap indicates one of the wires within the bus by number, starting from zero. For example, a bus indicated to contain 101 elements by use of the slashed oblique line and associated integer will contain 101 individual wires that may be specified by index numbers 0 through 100. A delimited pair of integers, for example 3:0 is taken to indicate, in order, the wires with index 3, index 2, index 1 and index 0.

Element 70 is the iconic representation of the 101 instances of the circuit of FIG. 6. Where that icon 70 is attached to a bus of 101 wires, as is the case, for example in the peripheral area marked "Sample", this is taken to represent the connection of each of the 101 wires within the bus to each of the 101 separate instances of the FIG. 6 wire labelled "Sample". Where the icon 70 is attached to a single wire, as is the case in the peripheral area labelled "Ain", that single wire is taken to connect to all of the wires labelled "Ain" within the 101 instances of the circuit of FIG. 6. Consequently, it is clear that the analog input connects to all SHA elements 60 within FIG. 6. The busses and the indices on the taps complete the connectivity. For example, consideration of the busses emerging adjacent to the area marked Aleft and Aright will indicate that Aleft bus element index 0 is connected to Aright bus element index 100, Aleft bus index 1 is similarly connected to Aright bus index 99. The other connections, namely Aleft bus indices 100 down though to 2 are connected to Aright bus indices 98 down though to 0. Similar consideration applied to the wires Din and Doutb will show that they are connected in sequence from the first ($0^{th}$) through to the last ($100^{th}$) iteration of the elements of FIG. 6. The wires labelled Sample are connected such that the Sample input to iteration Nth of the circuit of FIG. 6 will be connected to the (N−11)th iteration of the circuit on its Din connection, and where N is less than 11, to the (N+101−11)th iteration. Thus, in the circular connection of instances of FIG. 6 as obtained by consideration of the Din and Doutb connections, Sample is connected to the element that appears 11 instances prior to itself in the chain. This is provided so that the "wave front" of signals as they progress through the delaying elements (NOR gates 62) will activate the sample device M3 of 60 for a time interval equal to 11 of the unit delay times. This choice of 11 is arbitrary but serves to indicate one possible means to derive the sample pulse from the delay elements. The construct "DGnd#100" is taken to indicate a connection of each of the 100 wires within the associated bus to the DGnd (ground) terminal. The presence of the Start terminal connected as shown is to provided for the application of a pulse, initially at a logical high level, which when taken to a logic low level, begins the sequence of delays generated in the circular connection of elements 62. Finally, the collection of output wires shown in 71 is merged into a common pair of output wires to be considered output and inverse output. These wires provide for the function of a addition of the signals emerging on the Aout and Aoutb wires. The exact connection being made as Aout to output terminal, Aoutb to inverse output terminal; or as Aoutb to output terminal and Aout to inverse output terminal as required by the sign of the coefficient value as described above.

Figure 8:
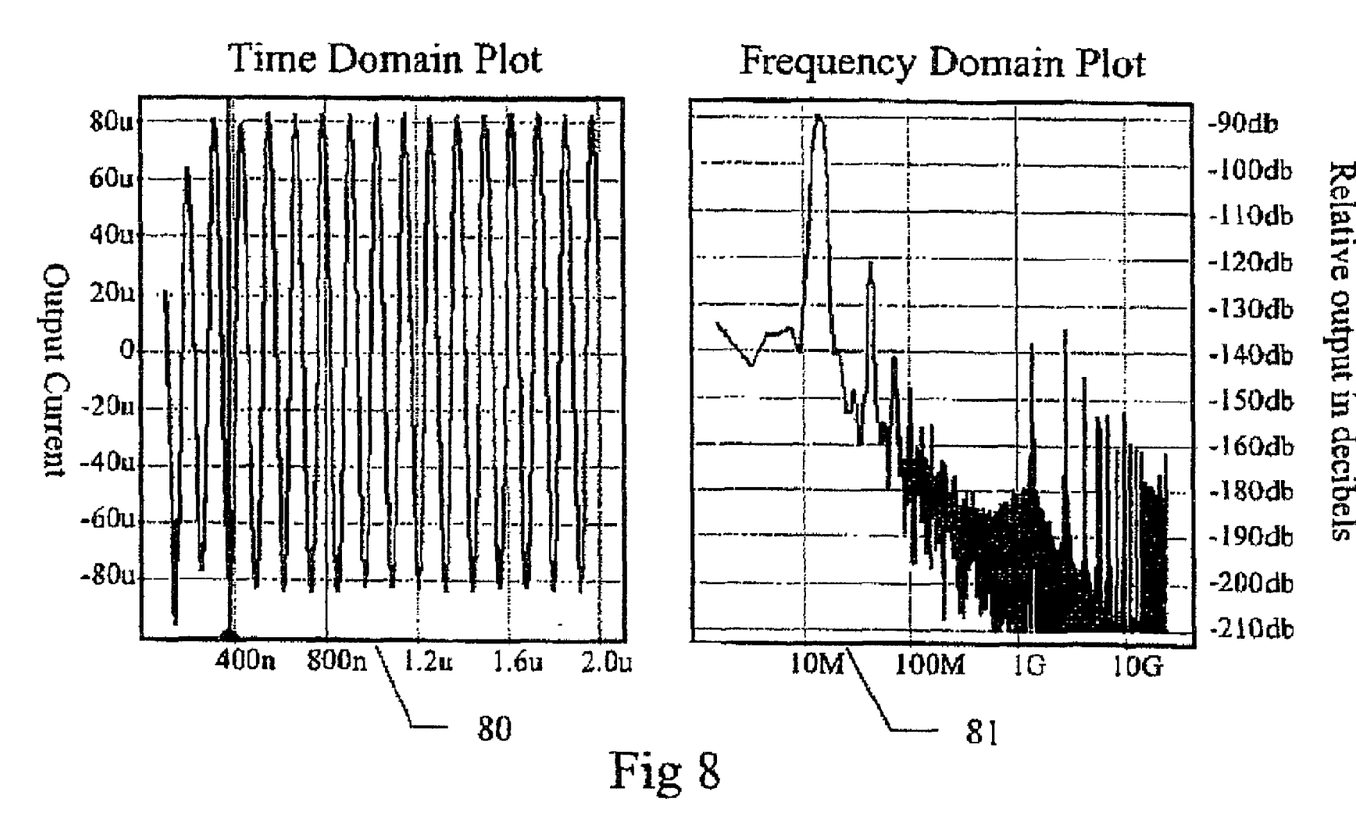

FIG. 8 shows the results of a SPICE simulation of the circuit as described in FIGS. 6 and 7. Coefficient values have been applied to the array such that 25 cycles of coefficient values occur within the 101 elements, the delay through the elements 62 is set to be 293.86 pS. Hence the virtual signal against which the input is to be correlated is at a frequency of 25/(101·293.86 pS)=842.32 Mhz.

The coefficient values are the magnitudes of the sequence generated for n=0 . . . 100 in the expression $C_n$=sin(n·25·2·π/101); the connectivity of Aout and Aoutb is modified with the sign of sequence, the connections are:

$$C_n \begin{vmatrix} > 0 & Aout \rightarrow \text{output}; Aoutb \rightarrow \text{inverse\_output} \\ < 0 & Aout \rightarrow \text{inverse\_output}; Aoutb \rightarrow \text{output} \end{vmatrix}$$

In the condition where $C_n$=0 no connection is necessary since no current flows, but for convenient implementation either connection may be chosen. In this way although the values of magnitudes of $C_n$ are clearly all positive numbers, the sign is accounted for in the output connections. In this preferred implementation the sequence of coefficients $C_n$ indexed by n is not the in the same sequence as the set of instances connected by Din and Doutb. Specifically, because the delay element 62 introduces a logical inversion, the output of any example of the instance 62 which follows a change to its input is not the next delay in time because the edge is in the "wrong" direction. Indeed, the logically next output occurs in the gate 50 steps ahead in the sequence since that gate has just passed the inverse logic signal when compared to this example gate, hence it is the output of the gate 50 steps ahead in the chain that constitutes the logically next output in time. Therefore, the connection of the coefficients indexed by $C_n$ to the instances of the circuit in FIG. 6 is as follows. $I_n$ is taken to indicate the n instance in the chain as connected by Din and Doutb:

$$\sum_{n=0}^{50} \Big| I_{2n} = C_n; \sum_{n=0}^{49} \Big| I_{2n+1} = C_{n+51}$$

After connection in this way an input signal of 100 mV peak at 853 Mhz is applied to the Ain wire as in FIG. 7 and FIG. 8 shows the simulation result. Plot 80 is the time domain result in terms of the current difference between the current in the output terminal and the inverse output terminal. Plot 81 is a Fourier analysis of this signal showing the expected approximately 10 Mhz difference signal present at the output. [Other resonances shown, namely those at higher frequencies and below −120 dB axis marker, are created due to non-linearities in the multiplier elements which are not the subject of this disclosure].

The invention is therefore a system of interconnected analog components that continuously evaluates at least one sum of products. This sum of products represents the correlation of an apparent signal generated by the deliberate avoidance of advancing the coefficient weight with the signal pipeline. This results in an architecture that can implement the signal pipeline as a distribution in sequence of the input signal to sample and hold elements which may be continuous or digitizing in nature, to as little as a single bit of discrimination. The process therefore differs from the prior art approaches to the discrete time approximation of a continuous integral because of the lack of advancing the coefficient pipeline.

The operation of summation over the index n where n is an index into an array of samples in time is conveniently implemented by a multiplicity of analog sampling elements whose sampling signal is shifted in time relative to the other sampling elements.

Although the preferred embodiment has sometimes been described herein in relation to a radio filter implementation, the invention is not limited to such applications. For example, in a practical radio application, the invention would be implemented as parallel sets of arrays for the normal and quadrature channels with an RMS evaluation. However, the description herein includes the disclosure of a correlator wherein at least one of the signals to be correlated is created as a result of the sequential sampling adjacent to differing coefficients in the array. Such a correlator may be useful in a large number of applications.

It will also be appreciated that other variations and modifications may be made to the preferred and alternative embodiments and different applications thereof may be implemented without departing from the broader principles of the invention.

The invention claimed is:

1. A circuit for correlating an input signal comprising:
   a parallel array of processing elements, each of said processing elements comprising an analog sampling circuit for sampling the input signal in response to a timing signal, and a circuit for scaling the resulting sample according to a predetermined scaling factor;
   a timing circuit for causing said timing signal to be presented in time-delayed succession to successive ones of said analog sampling unit processing elements, said timing circuit comprising a timing element in parallel with an associated analog sampling unit processing element, and said timing element comprising a phase lock loop or a delay lock loop; and, means for multiplying the output of each analog sample unit processing element to scale the output and summing the scaled outputs of said processing elements.

2. A circuit as in claim 1 wherein the scaling factors in successive processing elements correspond to the coefficients in a Fourier series approximation of a desired frequency response.

3. A circuit as in claim 1 wherein said timing circuit comprises a plurality of delay elements, the outputs of which are presented to successive ones of said processing elements.

4. A circuit as in claim 1 wherein said circuit for scaling comprises a multiplier having as inputs the output of said sampling circuit and a predetermined scaling factor, the outputs of said multipliers being summed.

5. A circuit as in claim 1 wherein the scaling factors in successive processing elements correspond to the coefficients in a Fourier series approximation of a desired frequency response, said timing circuit comprises a plurality of delay elements, the outputs of which are presented to successive ones of said processing elements, and said circuit for scaling comprises a multiplier having as inputs the output of said sampling circuit and a predetermined scaling factor, the outputs of said multipliers being summed.

6. A circuit as in claim 1 wherein said scaling factors are adjusted to alternate between scaling factors representing alternately a normal and a quadrature channel sets of coefficients of a Fourier series approximation of a desired frequency response.

7. The circuit of claim 1 for correlating an input signal with an apparent reference signal wherein the apparent reference signal is embedded in an array of analog sampling circuits by means of scaling factors representative of the characteristics of said reference signal, and wherein the sampling point for the input signal advances through successive sampling circuits.

8. A circuit for correlating an input signal with a desired frequency response, comprising:
   a first and a second arrays of parallel processing elements, each of said processing elements comprising an analog sampling circuit for sampling the input signal in response to a timing signal, and a multiplier circuit for scaling the resulting sample according to a predetermined scaling factor;
   a timing circuit for causing said dining signal to be presented in time-delayed succession to successive parallel pairs of said analog sampling unit processing elements, said timing circuit comprising a timing element in parallel with an associated analog sampling unit processing element, and said timing element comprising a phase lock loop or a delay lock loop;
   a summer for summing the scaled output of said processing elements comprising said first array; and,
   a summer for summing the scaled output of said processing elements comprising said second array.

9. A circuit as in claim 8 wherein the scaling factors in successive processing elements of said first array correspond to the coefficients of a Fourier series approximation of the normal component of said desired frequency response and the scaling factors in successive processing elements of said second array correspond to the coefficients of a Fourier series approximation of the quadrature component of said desired frequency response.

10. A circuit as in claim 8 wherein said first array represents a normal channel and said second array represent a quadrature channel.

11. A circuit as in claim 8 wherein said timing circuit comprises a plurality of delay elements in series, the outputs of which are presented to successive ones of said processing elements in sequence.

12. The method of correlating an input signal to an apparent reference signal, comprising:
   providing phase shifted timing signals to a plurality of analog sample and hold circuits to generate a series of phase shifted analog samples of the input signal;
   multiplying successive ones of said samples by coefficient values representing the normal component of said reference signal to scale said samples;
   multiplying successive ones of said samples by coefficient values representing the quadrature component of said reference signal to scale said samples;
   summing said normal scaled samples;
   summing said quadrature scaled samples; and,
   deriving the root mean square of said normal and quadrature sums.

13. The method of claim 12 wherein said coefficient values comprise the coefficients of a Fourier series approximation of the frequency response of said reference signal.

* * * * *